United States Patent [19]

Shomler et al.

[11] Patent Number: 5,446,871
[45] Date of Patent: Aug. 29, 1995

[54] METHOD AND ARRANGEMENT FOR MULTI-SYSTEM REMOTE DATA DUPLEXING AND RECOVERY

[75] Inventors: Robert W. Shomler, Morgan Hill; James E. McIlvain, San Jose, both of Calif.

[73] Assignee: International Business Machines, Armonk, N.Y.

[21] Appl. No.: 36,017

[22] Filed: Mar. 23, 1993

[51] Int. Cl.⁶ ............................................. G06F 11/34
[52] U.S. Cl. ................................ 395/180; 364/DIG. 1
[58] Field of Search .................... 395/575; 371/7, 21.6, 371/9.1

[56] References Cited

U.S. PATENT DOCUMENTS

| | | | |
|---|---|---|---|
| 4,287,592 | 9/1981 | Paulish et al. | 370/88 |
| 4,837,680 | 6/1989 | Crockett et al. | 364/200 |
| 4,862,411 | 8/1989 | Dishon et al. | 364/952 |
| 5,133,065 | 7/1992 | Cheffetz et al. | 395/575 |
| 5,155,845 | 10/1992 | Beal et al. | 395/575 |
| 5,163,148 | 11/1992 | Walls | 395/600 |
| 5,175,849 | 12/1992 | Schneider | 395/600 |

OTHER PUBLICATIONS

U.S. Ser. No. 07/781,044 filed Oct. 19, 1991 "Method and Means for Time Zero Backup Copying of Data".

Primary Examiner—Robert W. Beausoliel, Jr.
Assistant Examiner—Phung My Chung
Attorney, Agent, or Firm—R. Bruce Brodie

[57] ABSTRACT

A method and system for asynchronous remote data duplexing at a distant location from copies based at a primary site storage subsystem, which copying is non-disruptive to executing applications, and further in which any data loss occasioned by losses in flight or updates never received at the time of any interruption between the primary and remote sites are accounted for at the remote site. The method assigns a token and unique sequence number responsive to each write operation at the primary site, and sends the tokens+numbers and data updates to the remote site. The method relies upon the sequence number to establish a sequency and define gaps therein to ascertain missing updates.

5 Claims, 5 Drawing Sheets

METHOD AND ARRANGEMENT FOR MULTI-SYSTEM REMOTE DATA DUPLEXING AND RECOVERY

FIELD OF THE INVENTION

This invention relates to data preservation in an information handling system by asynchronous remote data duplexing (also termed remote dual copying), and more particularly, to the copying of data at a distant location from copies based at a primary site storage subsystem, which copying is non-disruptive to executing applications, and further in which data loss occasioned by losses in flight or updates never received at the time of any interruption between the primary and remote sites (fuzziness) are accounted for at the remote site. Typically such disruptions are caused by natural or man made disasters rendering the work and data at the primary unavailable and mandating that any continued work interact with the data copied and stored at the remote site.

DESCRIPTION OF RELATED ART

Data copying is one form of data preservation in an information handling or computer system. However, data preservation via data copying must take many factors into account. This is of special significance where it is anticipated that data copied and stored at a remote site would be the repository for any continued interaction with the data should the work and data of a primary site become unavailable. The factors of interest in copying include the protection domain (system and-/or environmental failure or device and/or media failure), data loss (no loss/partial loss), time where copying occurs as related to the occurrence of other data and processes (point in time/real time), the degree of disruption to applications executing on said computer, and whether the copy is application or storage subsystem based. With regard to the last factor, application based copying involves log files, data files, program routines while storage based copying involves an understanding of DASD addresses and data set identifiers.

As set forth below, the prior art is replete with methods and means for backing up and/or duplexing data for recovery and archiving purposes. While some inconsistency between an original and copied data set might be tolerable, it is the ignorance of the occurrence of missing data that makes such fuzziness unacceptable. That is, fuzziness of a copy set means that a recovery process cannot determine the state of the data copy.

One prior art method for generating consistent backup data (lossless copying) involves copying a portion of DASD stored data onto magnetic tape once a day (point in time copying) and transporting the tape media to a distant location via truck. Thus, truck transport of tape copied data (assume each tape reel storing 200 megabytes of data, if moved by a truck carrying 200 such tape reels to a remote site 50 miles away from the primary in say one hour) would be communicating at an average rate of 40000 MB/3600 sec or 4,444 megabytes per sec. Such data duplexing practice circa the 1950's was totally application disruptive. Furthermore, it offered at best inconvenience and a day's worth of difference in data state between the primary and remote sites.

Still another method involves use of telecommunications (such as T1 lines) for moving the backup copy. More time-current, even up-to-the-minute remote copies are offered by some data base management systems (IMS, DB2). While such remote copying occurs in real time, it however relies upon an application based rather than a storage based copy as communicated over a continuously available dedicated path between sites.

Cheffetz et. al., U.S. Pat. No. 5,133,065 "Backup Computer Program for Networks", issued Jul. 21, 1992 discloses a local area network (LAN) having a file server to which each local node creates and transmits a list of local files to be backed-up. Such remote generation is for the purpose of reducing the traffic occasioned where a network server initiates the list creation and file copying activity. Arguably, art prior to this reference taught centrally administered file selection. This resulted in compromises to local node security and overuse of the server. This is presumptively avoided by Cheffetz's local node generated lists and remission of the lists to the file server.

Clearly, Cheffetz sets out a form of point in time copying with some concern for balancing loads and security. However, there is no provision for data integrity i.e. accounting for any fuzziness in the data actually copied by the file server.

Mikkelsen, co-pending application, "Method and Means for Time Zero Backup Copying of Data", U.S. Ser. No. 07/781,044, filed Oct. 19, 1991, teaches the backup copying of designated datasets representing point in time consistency in a CPU on an DASD storage subsystem concurrent with CPU application by suspending execution only long enough to form a logical to physical address concordance and thereafter physically backing up the datasets on the storage subsystem on a scheduled or opportunistic basis.

Mikkelsen's method and means advantageously provide point in time copying of selected storage based data sets on an non-application disruptive basis. Nevertheless, the shortcoming is that in point of time data would arrive at the remote site as a snapshot of data as of the time the concurrent copy started. This represents a data state many hours earlier than subsequent data updates. Note, asynchronous remote data duplexing is a copy operation occurring in real time in which updates are being continuously sent ahead.

Dishon et al, U.S. Pat. No. 4,862,411, "Multiple Copy Data Mechanism on Synchronous Disk Drives", issued Oct. 29, 1989, ensures a dual copy by causing parallel write paths to a DASD pair to be synchronized independently of the CCW chain and avoids the single control unit dual copy path such as is shown in Crockett et al, U.S. Pat. No. 4,837,680, "Controlling Asynchronously Operating Peripherals", issued Jun. 6, 1989. In such systems as the IBM S/370 and the like, a virtual computer termed "channel" was used to manage the path establishment and data transfer between the CPU main memory and external storage. Control was expressed in the form of channel control words (CCW's) communicated by the channel to the control unit of external storage for interpretation and execution.

Dishon exemplifies real time, non-application disruptive copying which preserves data against media or device failure but does not treat system or environmental failure such as would be occasioned by a failed primary site.

Beale et al, U.S. Pat. No. 5,155,845, "Data Storage System for Providing Redundant Copies of Data", issued Oct. 13, 1992, dual copies variable length records (CKD) on two or more external stores by causing a write operation to be processed by the first storage controller and communicated in parallel over a direct link (broad band path) to a second storage controller. This obviates the path length limitation between a primary and a remote copy site. Such a limitation is occasioned by the fact that CKD demand/response architecture is length (bandwidth) has been limited to a range approximating 150 meters.

Beal in the manner of Dishon treats real time, non-application disruptive dual copying which preserves data availability only in the presence of device or media failure.

Stated another way, updating a remote site asynchronously and independently from a primary site involves an appreciation of how write update operations are generated at a primary site. In this regard, a primary site includes one or more applications concurrently executing on a processor in which each application generates what is termed "application dependent writes". That is, the storage subsystem has no knowledge or awareness of the write operations or their queued scheduling to be invoked or called via the operating system. Varying delay is endemic. Applications do not write merely to a single or the same DASD. Indeed, they may cluster their writes in differing patterns such that both the queue length and the queue service rate vary among the DASD storage devices for both initial write and copy generating purposes. This means that the copies received at the remote site have a reasonably high probability of being in an out-of-order sequence much of the time and subject to delay or loss.

In a word, asynchronously and independently executing applications and processors create a stream of write operations against local storage and remote sites, which stream is both enqueued and executed at different rates resulting in a near random ordered copy sequence.

SUMMARY OF THE INVENTION

It is an object of this invention to devise a method and means wherein the integrity of an asynchronously maintained remote dual copy of data to be the same as that of the primary copy less those updates in flight or updates which were never received at the time the update copy source was interrupted.

It is yet another object of this invention to devise a method and means for use of a store and forward message interface at the DASD storage management level between a source of update copies and a remote site in which the difference in update completeness or loss could be completely specified in the event of interruption.

It is still another object of this invention to devise a method and means by which both the sequency and completeness of data sets may be recovered determined from the asynchronously and independently generated copies and information provided by a primary site to one or more remote data duplexing sites.

The objects of this invention are satisfied by a method and means is used in a system comprising at least one processor, at least one instance of an operating system (OS) resident at said processor, a DASD external store, means responsive to applications executing on said processor for asynchronously and independently writing updates to external storage through calls to said OS, and means for writing a dual copy of said updates at a site remote from said external storage.

The method and means include the steps at the host processor of:

(a) forming a write token, said write token includes a unique sequence number+an external store address responsive to each write operation at the external store;

(b) establishing a path and sending messages between the external store and the remote site wherein each message selectively includes a list of recently generated write tokens+counterpart update data of listed tokens sent in the same or previous messages; and (c) at the remote site and responsive to each received message from the processor, maintaining a pending write queue to match data with tokens, scheduling and writing matched tokens and updates at the remote site only in runs of matched tokens and updates and in queue order.

In this invention, the processor OS notifies the DASD external storage subsystem that data update shadowing of certain extents (sets of tracks and cylinders) is to be performed, the term "shadowing" connoting the propagating of copies to the remote site. The DASD storage subsystems then monitor those extents for write activity, and notifies a sequencing service that a write operation is in progress. This notification is provided by a DASD-token that describes the DASD tracks and records that are being written. The sequencing service combines the DASD-provided token with a sequence number that marks the time sequence of that write operation relative to all others that are being shadowed within the cooperating set of systems. When this sequence number has been assigned and the write data transferred to the subsystem, the subsystem may signal operation complete to the host that initiated the I/O write operation. The token and sequence number are also sent together to the secondary location via asynchronous message to provide advance information that the identified DASD will be updated.

Subsequently, a data mover operation, after having been given the sequence number and token, retrieves the updated data from the subsystem and causes it to be sent, together with sequence number and token, to the remote or secondary location. The remote or secondary location causes the DASD update data to be queued as it is received. Afterwards, the remote location schedules accessing operations on its locally stored information to update its shadow (duplex) data copies in the same-sequence as they appeared at the primary systems. In the event of disaster at the primary location, a recovery process at the secondary data location can interpret the sequenced tokens and data updates received at the secondary to present a consistent-in-time image of that data as it was at the time of the last update data that was received at the remote or secondary site.

Satisfaction of the foregoing objects requires that any recovery process at a remote or secondary site be able to provide an image of DASD data at the recovery location that is equivalent to the data that would have been on DASD at the primary location had the primary system complex suffered a complete and total outage but with no equipment destruction. Following execution of the recovery process at the remote location, the secondary data should appear to applications executing upon system processors exactly as it would have to the primary following an initial systems startup IPL some short time earlier at the primary. The amount of time "earlier" is a 'window of data loss' that can be varied as a function of the distance of recovery site from primary, bandwidth of transfer available between the primary and recovery site, and processing power available for the data mover.

DESCRIPTION OF THE PREFERRED EMBODIMENT

The invention can be conveniently practiced in a configuration in which each CPU in a system may be of an IBM/360 or 370 architected CPU type having an IBM MVS operating system. An IBM/360 architected CPU is fully described in Amdahl et al, U.S. Pat. No. 3,400,371, "Data Processing System", issued on Sep. 3, 1968. A configuration involving CPU's shared access to external storage is set forth in Luiz et al, U.S. Pat. No. 4,207,609, "Path Independent Device Reservation and Reconnection in a Multi-CPU and Shared Device Access System", issued Jun. 10, 1980. Luiz also describes the virtual computer or "channel" management and control of the external store through sequences or chains channel commands words and the like emanating from the "channel" and received and interpreted by the storage subsystem.

An MVS operating system is also described in IBM publication GC28-1150, "MVS/Extended Architecture System Programming Library: System Macros and Facilities", Volume 1. Details of standard MVS or other operating system services such as local lock management, sub-system invocation by interrupt or monitor, and the posting and waiting of tasks is omitted. These OS services are believed well appreciated by those skilled in the art.

Figure 1:
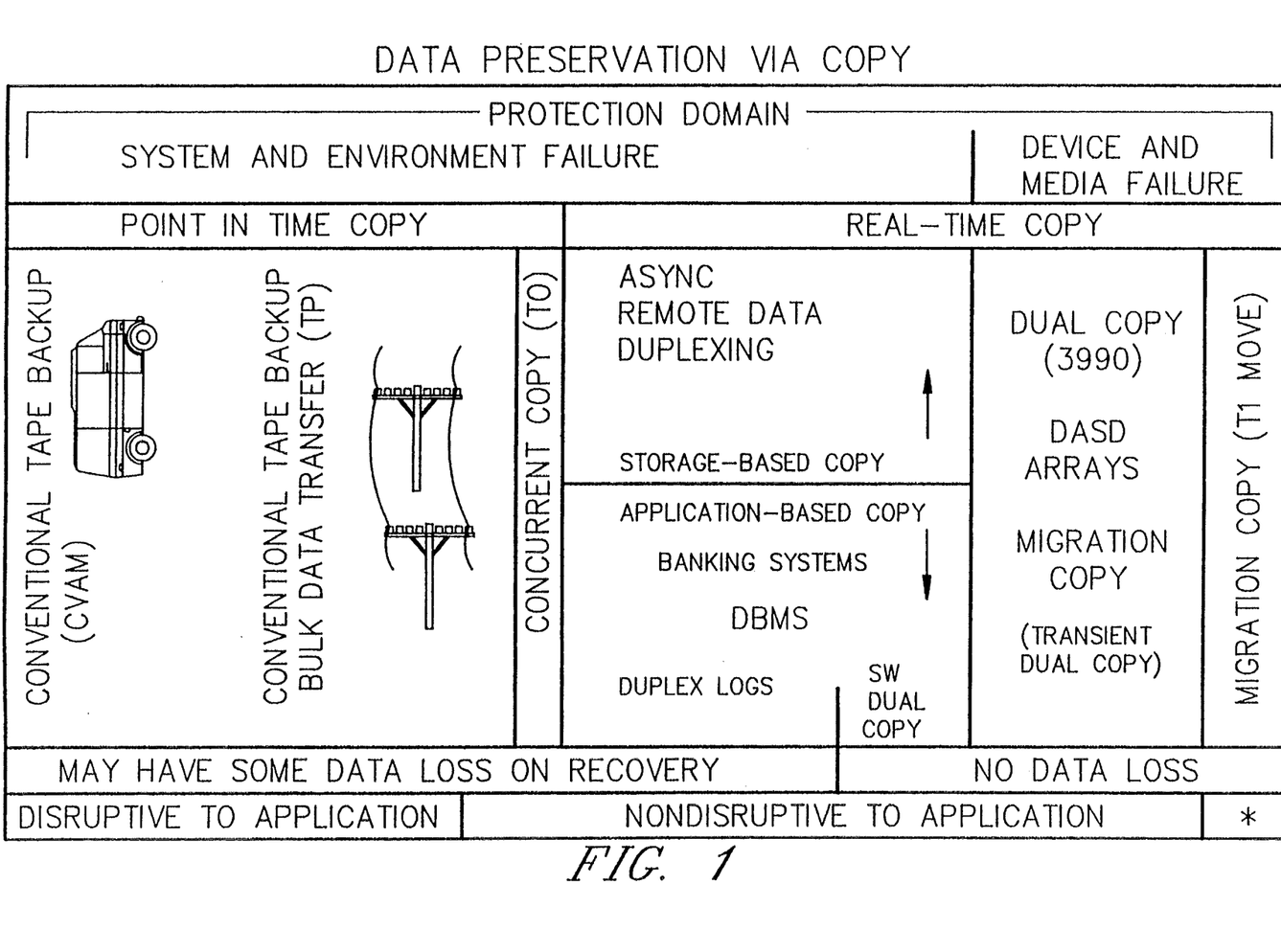
FIG. 1 sets forth a conceptualization of the diverse factors to be taken into account when preserving data via copying.

Referring now to FIG. 1, there is set out a conceptualization of the diverse factors involved in preserving data via copying in a system prone to either system or device failure. As depicted, the protection domain may encompass the system and environment or be limited to availability improvements at the device and media level.

As depicted in FIG. 1, point in time copying has historically been application disruptive. It requires that execution be suspended until the backup copy operation is completed. Contemporary systems provide for a scheduled movement from DASDs storage subsystems to tape. While the previously mentioned co-pending Mikkelsen application eliminates the disruptiveness of application execution and permits opportunistic scheduling of point in time backup, nevertheless its the data state at any duplexed site or repository always lags the current data state of the primary site.

According to FIG. 1, real time copying usually is non-disruptive of application execution, involves minimal or no data loss, and maintains the remote site up to date with the primary. Those real time copy methods involving DASD arrays and ranging from dual copying to writing specially partitioned redundancy coded groups of data blocks over devices asynchronously only enhance data availability with respect to device and media failure and do not take primary site unavailability into account.

Other real time copy methods based on communicating to a remote site call for a dedicated path and may very well lock up the processor, the storage subsystem, and the remote site. This typifies log based transaction management systems such as relational databases, automated tellers and the like. In such systems, only the application has cognizance of copy origination and the requirement that the data state be recoverable to a transaction consistent state following a failure.

Figure 2:
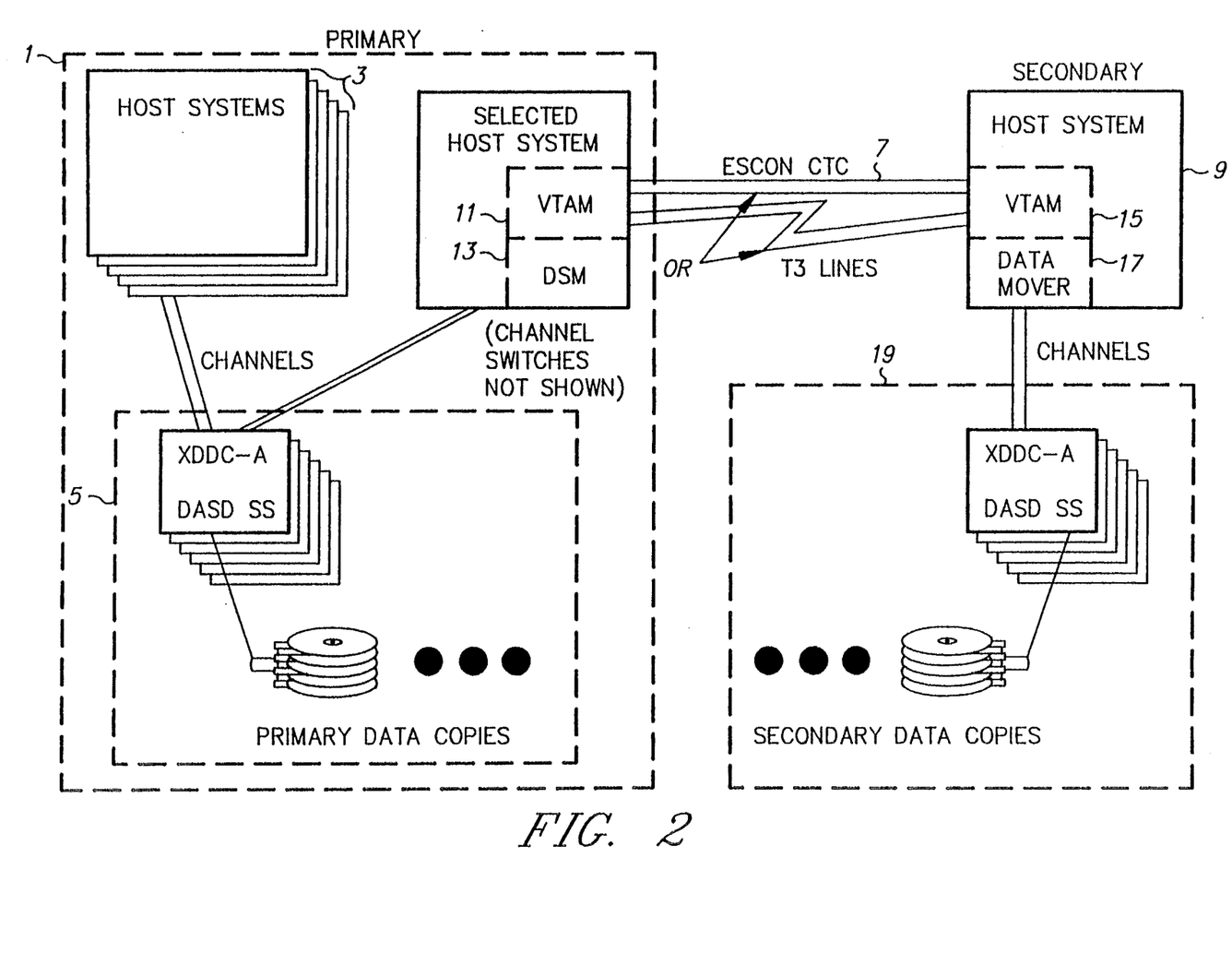
FIG. 2 depicts the network relationships or topology among the host processor, its attached external storage, the remote site on which data is duplexed, and the external storage subsystem/remote site communications interface.

Referring now to FIG. 2, there is shown a primary site 1 consisting of one or more systems 3 that share access to some number of DASD subsystems 5, and an interface 7 coupling remote or secondary processor locations 9. For the purpose of this invention, one of these systems will be designated the "selected primary system." Each selected primary system includes a processor having an operating system (OS). In turn, the OS includes a data serializer and mover (DSM) 13 and a Virtual Telecommunications Access Method (VTAM) 11 or the like for effectuating communications between the interface 7 and the remote site 9.

The serializer portion of DSM assigns a write sequence token to every write operation and puts these tokens into messages for VTAM 11 to send to a receiving system (VTAM 15 and Data Mover 17) at the secondary location (remote site 9). Also, the data mover portion of DSM 13 obtains changed data-records written to the primary DASD-and forms them and their tokens into messages for VTAM 11 to send to the secondary site 9.

VTAM 11 is the host processor portion of the Systems Network Architecture (SNA) described in "An Introduction to Network Architecture's and protocols," by P. E. Green and printed in the IBM System Journal, Vol. 18, No. 2, 1979. For additional details of VTAM operation and implementation reference also may be made to Harris et al, U.S. Pat. No. 4,914,619, "Apparatus and Method for Interconnecting an Application of a Transparent Services Access Facility to Remote Source", issued Apr. 3, 1990, Astride et al, U.S. Pat. No. 4,855,905, "Multiprotocol I/O Communications Controller Unit Including Emulated I/O Controllers and Tables Translation of Common Commands and Device Addresses," issued Aug. 8, 1989. Note, VTAMs 11 and 15 are functionally operative at both the primary 1 and secondary 9 sites.

Referring again to FIG. 2, the purpose of VTAMs 11 and 15 and SNA or ESCON connection 7 in the primary 1 and secondary systems 9 is to communicate messages there between. These messages communicate the establishment of shadowed (duplexed) data extents, tokens that indicate updates in progress, and tokens with changed data to be applied to the secondary data copies. VTAM is operative on high bandwidth communication networks of one or more channel-to-channel (CTC) connections coupling the primary and secondary systems. T1 lines, T3 lines, or other telecommunications services may be employed to support distances greater than ESCON or other direct CTC connections can support. The secondary 9 may be at any distance from the primary site 1.

Similarly, the OS resident in the processor portion of secondary system 9 has a data mover component 17 in addition to its above-described VTAM 15 OS based service. The secondary data mover 17 receives the messages sent by the primary via VTAM 15, extracts and maintains the sequencing tokens, and applies updated data to copies of the DASD at the secondary site.

Duplexing operation is established for selected DASD, volumes or extents, by the primary system similar to the method for establishing a T-zero (T0) Copy session such as is described in the co-pending application Mikkelsen application. In the Mikkelsen method, the primary data mover reads a T0 point-in-time copy of the identified data extents and sends that data to the secondary to establish an initial secondary copy of the duplexed data. Once the duplexing session has been initiated (with or without an accompanying Time Zero copy), the DASD subsystems will monitor those extents for data writes and take the following action when a write operation is begun.

Write Operations at The External Storage Subsystem of the Primary Site

Figure 3:
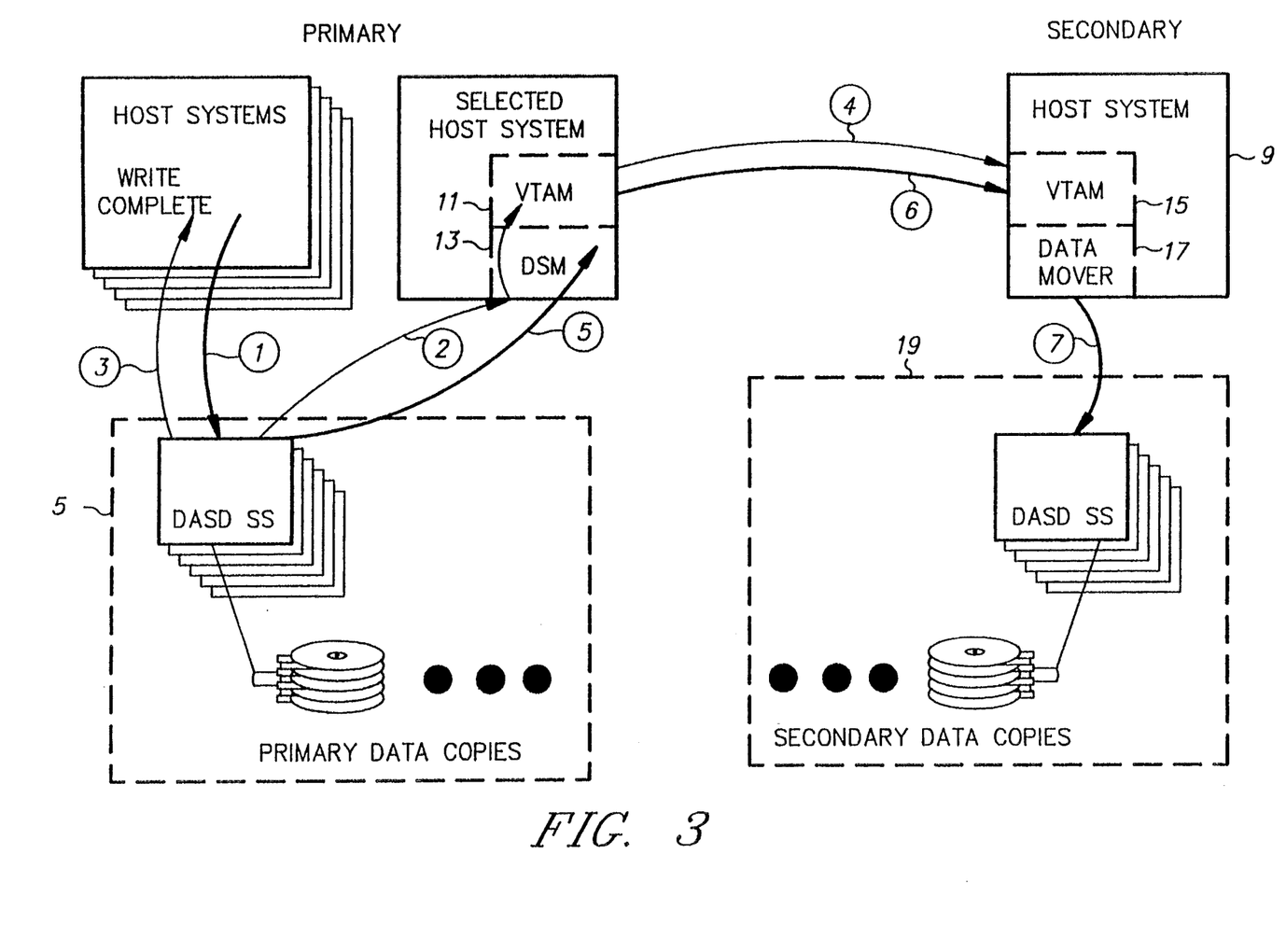
FIG. 3 shows the same relationships as FIG. 2 with a numbered path sequential activity indication.

Referring now to FIG. 3, there is shown a numbered path sequential activity indication for the configuration depicted in FIG. 2. In this regard, at the primary site the channel portion of OS and the processor generates a CCW that initiates a data write sequence to a duplexed DASD address. This is processed by primary DASD subsystem 5 (this may be the first of several CCWs for that sequence, as for an ECKD Locate Record CCW); data moves from the writing system to the primary DASD over path (1). The primary DASD subsystem sends a write token over path (2) to the DSM serializer 13 (which may be or may not be on the same system that is writing the data to DASD). The request token identifies the duplex session, device, tracks and records to be written. It may also contain a unique subsystem event token. The DSM serializer 13 assigns a global sequence number to that DASD token and adds the combined sequence+DASD token to the next message that will be passed to VTAM 11 to send to the secondary or remote site 9. The message is sent to site 9 over path (4).

The DASD subsystem 5 performing the DASD data write completes its data write operation and signals write complete to the requesting system over path (3). (If this is the end of the host channel program, the write complete will be posted to the requesting program; otherwise the channel interprets the signal to continue the channel program with the next operation.)

As a separate operation asynchronous to the original write operation, a data mover also resident in block 13 will read changed data from the DASD subsystem 5, using the DASD address information from the DASD-provided token described over path (5). The data mover 13 in turn will add that data together with its sequence token to the next message to be sent to the secondary site over a circuit including VTAM 11, the interface, VTAM 15, and data mover 17 see primary site/secondary site path (6). (There may be multiple data mover processes to accommodate the write traffic.)

Positive Return Token

A more robust embodiment of this invention involves the DSM 13 returning the write token with its assigned global sequence number to the DASD subsystem 5. The DASD subsystem subsequently appends the DSM-provided token to the changed data when it is sent to the data mover. This eliminates a potential uncertainty in the case of rapid multiple updates to the same record, a condition the base design described preceding must accommodate via programming. This positive return token method requires that the DASD subsystem maintain a persistent cross-I/O operation work list of pending tokens and associated data (by pointer), a design not suited to some track cache DASD subsystems (write update duplexing being by DASD record).

Data Copy Operations at the Secondary Site:

Once duplexing sessions have been established, the secondary site 9 receives notification of pending writes and the updated write data for DASD 19 it is maintaining in duplex copy. VTAM 15 receives the messages from the primary site 1 and passes them to the secondary data mover 17. Each of these messages contains three content segments, built by the primary data mover and interpreted by the secondary data mover.

Figure 4:
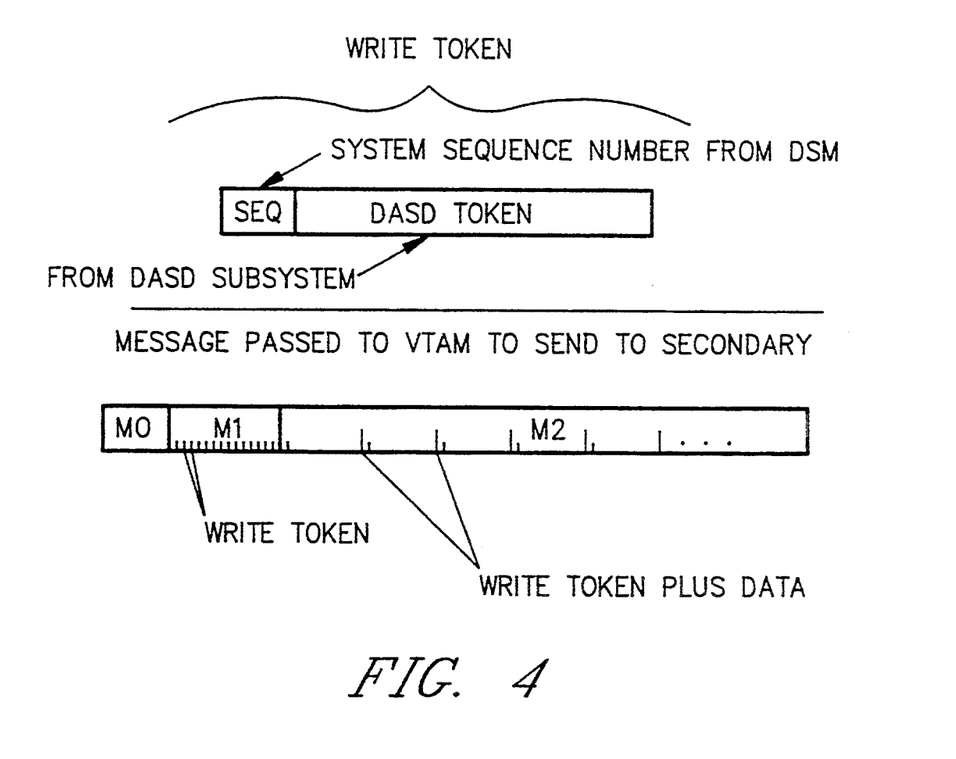
FIG. 4 sets out the format of the token, sequence number, and message formats utilized and communicated between the subsystem and the remote site.

Referring now to FIG. 4, there is depicted three segments of each message. These are designated as M0, M1, and M2.

M0 is a data-mover 13 -to-data-mover 17 header that serves to maintain logical continuity of the message stream and identifies the message content. Message content may include token-data transmission (M1–M2), establish or terminate duplex sessions, transmit initial copy point in time copy or other form of initial data copy, communicate logical acknowledgments (acks) from secondary to primary, and for exception notification and recovery actions.

M1 contains the set of tokens assigned by the primary DSM since the preceding message. These represent write operations in progress for which data is not at the secondary.

M2 contains a set of fields, with each field containing a token plus the write (update) data associated with that token.

The length of the message and the frequency of their transmission are design considerations that trade off inter-system transmission efficiency with the amount of time delay in notifying the secondary of write operations in progress. Efficiency is achieved by batching pending tokens and data into messages, amortizing transmission overhead over a larger number of M1 and M2 message elements. Shorter, more frequently sent messages incur a greater total transmission overhead but act to keep the secondary closer in sync with (less behind) the primary. The concept is that the primary data mover will pass a message to VTAM when the message buffer has filled or at the expiration of a time interval since the preceding message was sent, whichever is shorter. Both message buffer size and the time interval are assumed to be selectable.

Each token contains sufficient information for the secondary data mover to be able to determine what physical DASD records are to be updated, and to order these writes in the same sequence that the sequence tokens were assigned (which is the same sequence as seen by the applications that performed the write operations on the primary DASD. The secondary data mover first sees each token as it is received in the M1 message segment. The data mover uses these tokens to maintain a pending write queue. As data for each token is received in M2 segments, it is matched with its token in the pending write queue (FIGS. 3 and 4).

The secondary data mover 17 schedules write operations to the secondary site DASD storage 19 in the sequence of its pending write queue entries. This is shown in FIG. 3 as queued movement over path (7). That is, data for a given queue entry is not scheduled for write until queue elements ahead of it have been scheduled for writing to DASD. Data arrives in M2 message segments as a function of when it was provided by the primary data mover. These data arrivals are likely not to be in strict update sequence. Thus at any given time of activity, the pending write queue may have a sequence of complete entries-tokens plus associated write data, 'incomplete' tokens-without write data, followed by more complete followed by more complete tokens and incomplete tokens. This is illustrated in FIG. 5.

DASD data recovery at the secondary on failure of the primary:

The above described messages provide information at the secondary system 9 for recovery of primary data being duplexed. If the primary site 1 experiences a disaster such that data recovery on the secondary system is called for, system operational procedures may invoke recovery operation at the secondary for all or any part of the data being duplexed.

Figure 5:
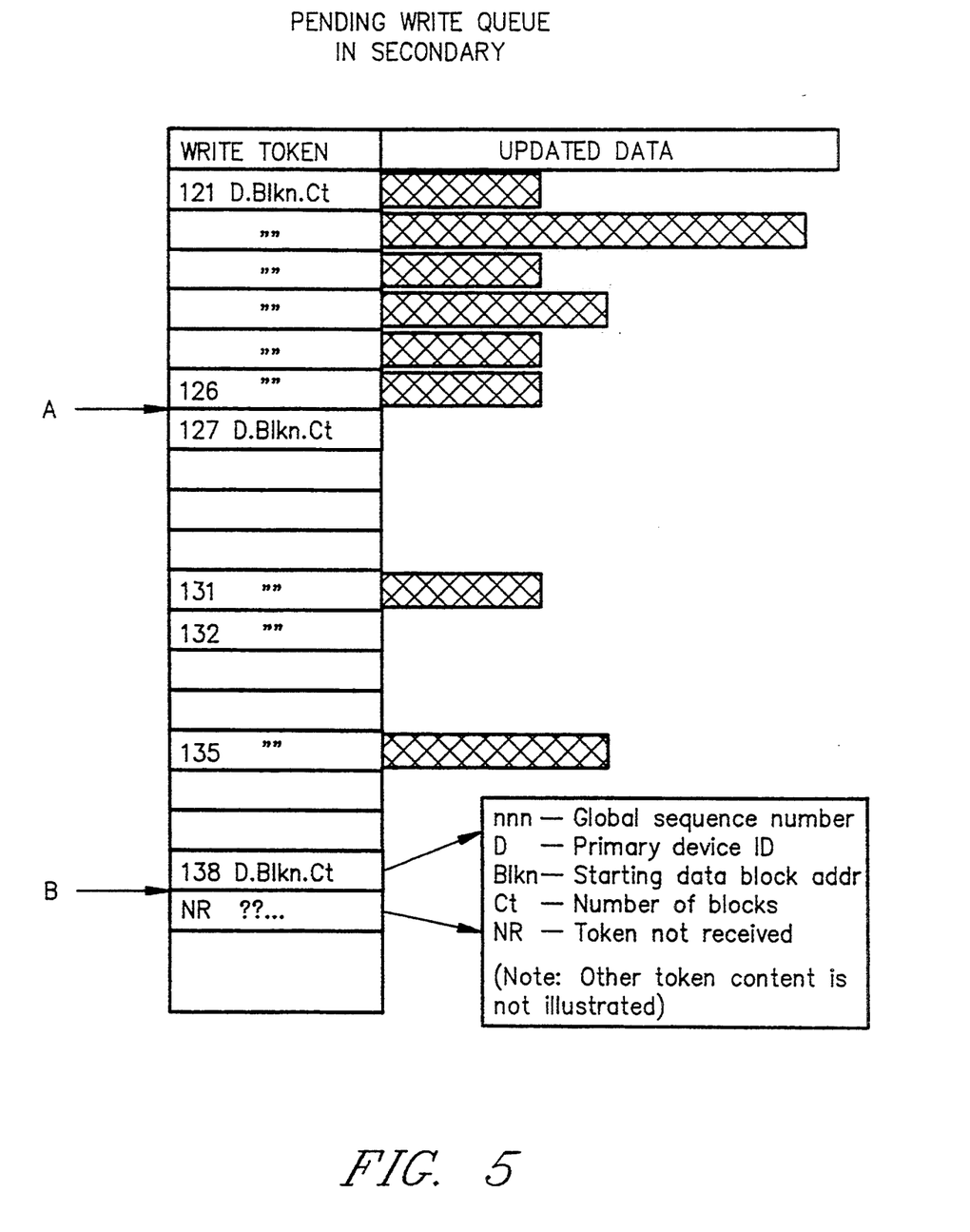
FIG. 5 illustrates a queue of the messages and tokens at the remote as a snapshot of the write update activity at the primary site at a time previous.

Referring now to FIG. 5, a recovery process for the system using the second site begins by completing pending data writes from the pending write queue up to the point of the first incomplete token on the queue. Relatedly, data will be consistent to a point in time that it was some time earlier at the primary; i.e. some time preceding the primary failure. This is shown by 'A' in FIG. 4. This data will be behind the primary at the time of its failure by the remainder of entries in the pending write queue as represented by the entries between 'A' and 'B' in FIG. 4, and write operations that were scheduled and may have been executed at the primary but for which the DSM-assigned sequence token was NOT received at the secondary in an M1 message segment represented as following point 'B' in FIG. 4.

If systems recovery can use data consistent to the point of time, it can recover forthwith. This is expected to be much the same as a power-on initial systems initial program load (IPL) process at the primary had the primary failed without destruction of systems hardware or DASD data (i.e., jobs in progress and data in volatile memory will have been lost, and open data sets may be in inconsistent states; but data written to DASD subsystems can be accessed).

For those applications for which recovering and resuming operations requires more information about what data was lost at the primary, pending write queue content can be interpreted to identify the DASD tracks and records that had updates in progress at the primary prior to the failure, along with the sequence of those operations should that be significant in recovery. For some updates, even the updated data could be interrogated at the remote site, though these updates would not have been reflected in the remote DASD because one or more prior updates had not been received. These updates are illustrated as sequence numbers 131 and 135, between (A) and (B) in FIG. 5.

In addition, information sent as part of establishing the duplex sessions, or sent separately between cooperating storage management systems, can be employed to relate the DASD addresses of pending writes to the data sets to which they are a part of. The only write-in-progress that will not have been identified are those in the M1 being built but not sent by the primary, and any M1 messages in flight at the time of the failure. Thus the recovery process can identify to a very close point in time of the failure exactly what data was lost, if that is needed in restoring data sets to a consistent state and resuming system operations.

This new method defines a means for remote-distance storage-based data duplexing that provides for preservation of update sequence across all DASD of significance and minimizes the impact on primary write performance (minimizes the addition to DASD I/O write operation response time).

Previously known methods either a) require more than storage-based data knowledge, such as data base transaction commit point awareness, b) do not provide data consistency-preservation of data update sequence across all the DASD data duplexed, or c) operate synchronous with DASD I/O write operation, unacceptably adding to that I/O operation response time.

Extensions

One extension to the method and means of this invention is to take advantage of its considerable combinatorial flexibility. Illustratively, duplexing sessions may be established with multiple secondary locations, sending some primary data to one secondary, some to another, and some to more than one.

These and other extensions of the invention may be made without departing from the spirit and scope thereof as recited in the appended claims.

We claim:

1. A method for assuring integrity and recoverability of a data copy set at a site remote from a source of asynchronous independently generated sequence of application dependent write operations, comprising the steps of:
   (a) responsive to each write operation, forming a write token at the source, said write token including a unique sequence number and a source address;
   (b) establishing a path for sending messages between the source and the remote site and communicating messages on the path, each message preceding each other serially in time, wherein each message selectively includes a list of write tokens generated since the preceding message and a set of fields, each field containing a token and a write update data associated with that token; and
   (c) at the remote site and responsive to each received message from the source, maintaining a pending write queue and replicating the write operations sequence originating at the source by matching data addresses with tokens, scheduling, and writing matched tokens and updates at the remote site only when the data addresses match the tokens in runs and in order of appearance in the pending write queue.

2. The method according to claim 1, wherein said method further comprises the steps of:
   (d) responsive to an interruption of at least some portion of the write operations sequence, scanning the maintained pending write queue at the remote site and interpreting the messages received at the remote site so as to present a consistent-in-time image of data manifest by the sequence of write operations as the sequence of write operations was at the source.

3. The method according to claim 1, wherein step (b) further includes the steps of:
   establishing paths for sending messages between the source and a plurality of remote sites, communicating messages on the paths including either sending at least one message to a first remote site, sending at least another message to a second remote site, or sending at least one message to both said first and second remote sites.

4. A method for providing integrity of an asynchronously maintained remote dual copy of data to possess the same information content as that of a primary copy less those updates in flight or never received at the time an update copy source was interrupted, comprising the steps of:

(a) establishing a message interface between the update copy source and the remote site;

(b) responsive to each write operation at the source, generating a write token representing source address indicia and a unique sequence number;

(c) sending messages from the source to the remote site, each message preceding each other serially in time, each message selectively including a list of write tokens generated since the preceding message and a set of fields, each field containing a token and any write update data associated with that token; at the remote site, (d) responsive to each received message, maintaining a pending write queue to match addresses of the update data with tokens;

(e) scheduling and writing matched tokens and addresses of updates at the remote site only in runs of matched tokens and addresses of updates and in order of appearance in the pending write queue; and (f) in the event of interruption, comparison matching the write queue and any generated messages to exactly establish a point in time of update loss of the remote site.

5. A system comprising a processor; an operating system (OS) resident at said processor; an external storage means; means responsive to applications executing on said processor for writing updates to external storage through calls to said OS; and means for propagating dual copies of said updates at a site remote from said external storage means and asynchronous to application execution, said propagating means including means for asynchronously writing said dual copies of said updates at said remote site, wherein said dual copy means comprise:

(a) means responsive to each write operation at said external storage means for forming a write token including a unique sequence number and an external storage address;

(b) means for establishing a communications path between the external store and the remote site and for sending messages there between;

(c) means including the write token forming means and the communications path establishing means for sending messages on the path, each message preceding each other serially in time each message selectively including a list of write tokens generated since the preceding message and a set of fields, each field containing a token and any write update data associated with that token; and (d) means at the remote site responsive to each received message for maintaining a pending write queue to match addresses of the update data with tokens, for scheduling and writing matched tokens and updates at the remote site only in runs of matched tokens and addresses of the updates and in order of appearance in the pending write queue.

* * * * *

UNITED STATES PATENT AND TRADEMARK OFFICE
CERTIFICATE OF CORRECTION

PATENT NO. : 5,446,871
DATED : Aug. 29, 1995
INVENTOR(S) : R. Shomler et al

It is certified that error appears in the above-indentified patent and that said Letters Patent is hereby corrected as shown below:

Column 12, line 7 delete "means"

Signed and Sealed this

Twelfth Day of December, 1995

Attest:

BRUCE LEHMAN

*Attesting Officer*  *Commissioner of Patents and Trademarks*